(12) United States Patent
Sanuki et al.

(10) Patent No.: US 11,227,857 B2
(45) Date of Patent: Jan. 18, 2022

(54) SEMICONDUCTOR DEVICE AND METHOD OF MANUFACTURING THE SAME

(71) Applicant: Kioxia Corporation, Minato-ku (JP)

(72) Inventors: Tomoya Sanuki, Yokkaichi (JP); Masayoshi Tagami, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 44 days.

(21) Appl. No.: 16/809,739

(22) Filed: Mar. 5, 2020

(65) Prior Publication Data

US 2021/0082880 A1 Mar. 18, 2021

(30) Foreign Application Priority Data

Sep. 18, 2019 (JP) .............................. JP2019-169145

(51) Int. Cl.
| | | |
|---|---|---|
| H01L 25/065 | (2006.01) | |
| H01L 25/18 | (2006.01) | |
| H01L 23/00 | (2006.01) | |
| H01L 25/00 | (2006.01) | |

(52) U.S. Cl.
CPC .......... *H01L 25/0657* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/1434* (2013.01)

(58) Field of Classification Search
CPC . H01L 25/043; H01L 25/0657; H01L 25/074; H01L 25/0756; H01L 25/117; H01L 2225/06503–06596; H01L 24/08; H01L 24/80; H01L 2924/1434; H01L 2224/08148; H01L 2224/80895; H01L 25/18; H01L 2225/06524; H01L 25/50; H01L 2224/80896; H01L 2924/1426
See application file for complete search history.

(56) References Cited

U.S. PATENT DOCUMENTS

| | | | |
|---|---|---|---|
| 2018/0261575 A1 | 9/2018 | Tagami et al. | |
| 2019/0287955 A1* | 9/2019 | Iijima | ..................... H01L 24/80 |
| 2020/0266146 A1* | 8/2020 | Nishida | ............ H01L 27/11573 |
| 2020/0286875 A1* | 9/2020 | Nishida | ................. H01L 23/528 |
| 2020/0286905 A1* | 9/2020 | Kai | ..................... H01L 25/0657 |

FOREIGN PATENT DOCUMENTS

| | | |
|---|---|---|
| JP | 2010-129686 A | 6/2010 |
| TW | 201642393 A | 12/2016 |

* cited by examiner

*Primary Examiner* — Thanh Y. Tran
(74) *Attorney, Agent, or Firm* — Oblon, McClelland, Maier & Neustadt, L.L.P.

(57) ABSTRACT

In one embodiment, a semiconductor device includes a substrate, a plurality of transistors provided on the substrate. The device further includes a first interconnect layer provided above the transistors and electrically connected to at least one of the transistors, one or more first plugs provided on the first interconnect layer, and a first pad provided on the first plugs. The device further includes a second pad provided on the first pad, one or more second plugs provided on the second pad, and a second interconnect layer provided on the second plugs. The device further includes a memory cell array provided above the second interconnect layer and electrically connected to the second interconnect layer. A number of the second plugs on the second pad is larger than a number of the first plugs under the first pad.

20 Claims, 10 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-169145, filed on Sep. 18, 2019, the entire contents of which are incorporated herein by reference.

FIELD

Embodiments described herein relate to a semiconductor device and a method of manufacturing the same.

BACKGROUND

In a case where metal pads in wafers are bonded together to manufacture a semiconductor device, it is desired to prevent lowering of a yield due to the metal pads.

DETAILED DESCRIPTION

In one embodiment, a semiconductor device includes a substrate, a plurality of transistors provided on the substrate. The device further includes a first interconnect layer provided above the transistors and electrically connected to at least one of the transistors, one or more first plugs provided on the first interconnect layer, and a first pad provided on the first plugs. The device further includes a second pad provided on the first pad, one or more second plugs provided on the second pad, and a second interconnect layer provided on the second plugs. The device further includes a memory cell array provided above the second interconnect layer and electrically connected to the second interconnect layer. A number of the second plugs on the second pad is larger than a number of the first plugs under the first pad.

Embodiments will now be explained with reference to the accompanying drawings. In FIGS. 1 to 10, the same reference numerals will be assigned to the same components, and overlapped description will be omitted.

First Embodiment

Figure 1:
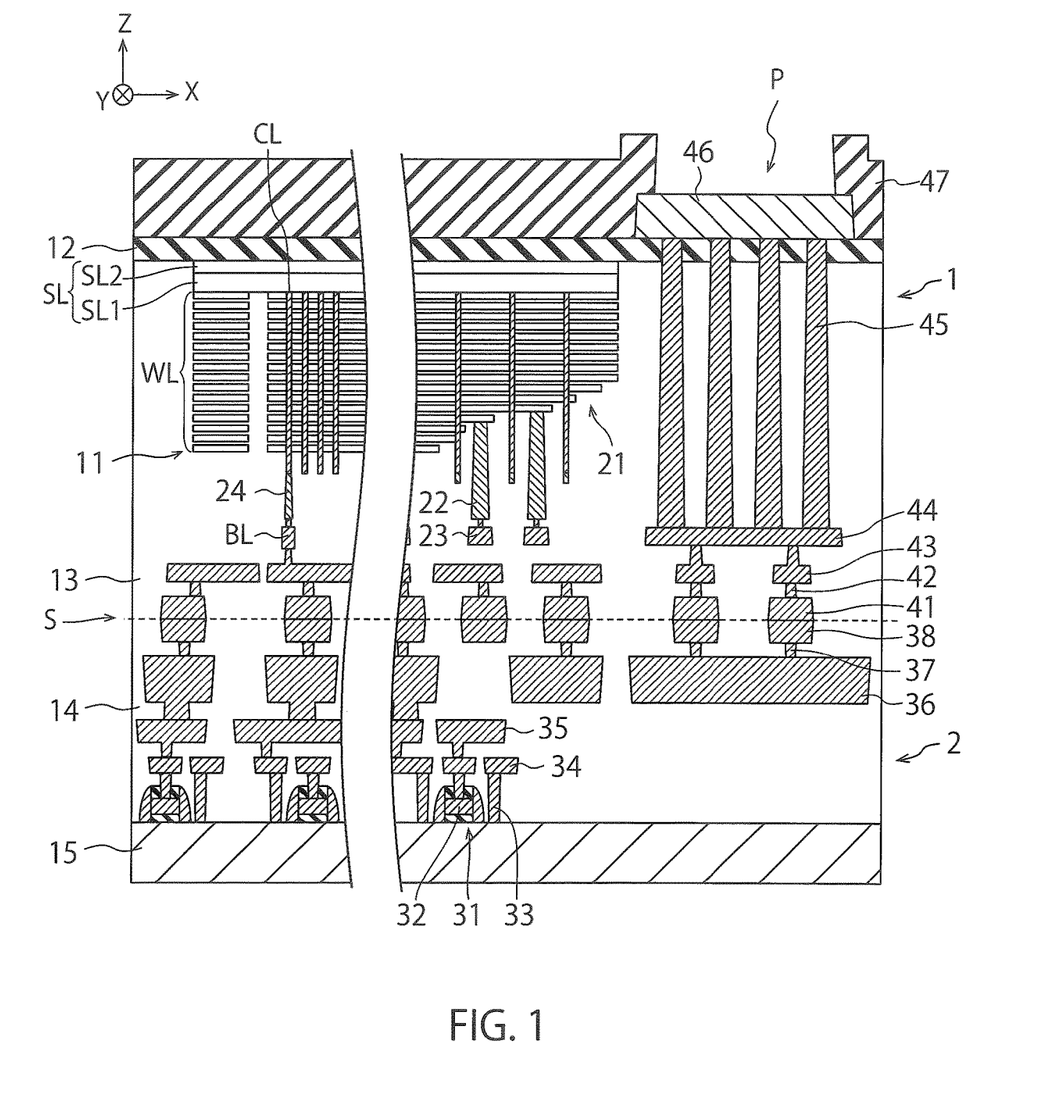
FIG. 1 is a sectional view illustrating a structure of a semiconductor device in a first embodiment.

FIG. 1 is a sectional view illustrating a structure of a semiconductor device in a first embodiment. The semiconductor device in FIG. 1 is a three-dimensional memory in which an array chip 1 is bonded to a circuit chip 2.

The array chip 1 includes a memory cell array 11 including a plurality of memory cells arranged three-dimensionally, an insulator 12 on the memory cell array 11, and an inter layer dielectric 13 under the memory cell array 11. The insulator 12 is, for example, a silicon oxide film or a silicon nitride film. The inter layer dielectric 13 is, for example, a silicon oxide film or a stacked film including a silicon oxide film and other insulators.

The circuit chip 2 is provided under the array chip 1. A reference numeral "S" indicates an interface of the array chip 1 and the circuit chip 2. The circuit chip 2 includes an inter layer dielectric 14, and a substrate 15 under the inter layer dielectric 14. The inter layer dielectric 14 is, for example, a silicon oxide film or a stacked film including a silicon oxide film and other insulators. The substrate 15 is, for example, a semiconductor substrate such as a silicon substrate.

FIG. 1 indicates an X direction and a Y direction which are parallel to a surface of the substrate 15 and which are perpendicular to each other, and a Z direction perpendicular to the surface of the substrate 15. In the present specification, a +Z direction is handled as an upward direction, and a −Z direction is handled as a downward direction. The −Z direction may match a direction of gravitational force or does not have to match the direction of gravitational force.

The array chip 1 includes a plurality of word lines WL and a source line SL as an electrode layer inside the memory cell array 11. FIG. 1 illustrates a stepwise structure portion 21 of the memory cell array 11. Each word line WL is electrically connected to a word interconnect layer 23 via a contact plug 22. Each columnar portion CL which penetrates through the plurality of word lines WL is electrically connected to a bit line BL via a via plug 24, and is also electrically connected to the source line SL. The source line SL includes a first layer SL1 which is a semiconductor layer, and a second layer SL2 which is a metal layer.

The circuit chip 2 includes a plurality of transistors 31. Each transistor 31 includes a gate electrode 32 provided on the substrate 15 via a gate insulator, and a source diffusion layer and a drain diffusion layer which are provided inside the substrate 15 and which are not illustrated. Further, the circuit chip 2 includes a plurality of contact plugs 33 provided on the source diffusion layers or the drain diffusion layers of these transistors 31, an interconnect layer 34 which is provided on these contact plugs 33 and which includes a plurality of interconnects, and an interconnect layer 35 which is provided on the interconnect layer 34 and which includes a plurality of interconnects.

The circuit chip 2 further includes an interconnect layer 36 which is provided on the interconnect layer 35 and which includes a plurality of interconnects, a plurality of via plugs 37 which are provided on the interconnect layer 36, and a plurality of metal pads 38 which are provided on these via plugs 37. The metal pad 38 is, for example, a Cu (copper) layer or an Al (aluminum) layer. The metal pad 38 is an example of a first pad, the via plug 37 is an example of a first plug, and the interconnect layer 36 is an example of a first interconnect layer. The circuit chip 2 functions as a controller (logic circuit) which controls operation of the array chip 1. This controller is configured with the transistors 31, or the like, and is electrically connected to the metal pad 38.

The array chip 1 includes a plurality of metal pads 41 provided on the metal pads 38, and a plurality of via plugs 42 provided on the metal pads 41. Further, the array chip 1 includes an interconnect layer 43 which is provided on these via plugs 42 and which includes a plurality of interconnects, and an interconnect layer 44 which is provided on the interconnect layer 43 and which includes a plurality of interconnects. The metal pad 41 is, for example, a Cu layer or an Al layer. The metal pad 41 is an example of a second pad, the via plug 42 is an example of a second plug, and the interconnect layer 43 is an example of a second interconnect layer.

The array chip 1 further includes a plurality of via plugs 45 provided on the interconnect layer 44, a metal pad 46 provided on these via plugs 45 or on the insulator 12, and a passivation film 47 provided on the metal pad 46 or on the insulator 12. The metal pad 46 is, for example, a Cu layer or an Al layer, and functions as an external connection pad (bonding pad) of the semiconductor device in FIG. 1. The passivation film 47 is, for example, an insulator such as a silicon oxide film, and has an opening portion P which exposes an upper surface of the metal pad 46. The metal pad 46 can be connected to a mounting substrate or other devices through a bonding wire, a solder ball, a metal bump, or the like, via this opening portion P.

Details of the metal pads 38 and 41, the via plugs 37 and 42, and the interconnect layers 36 and 43 will be described later.

Figure 2:
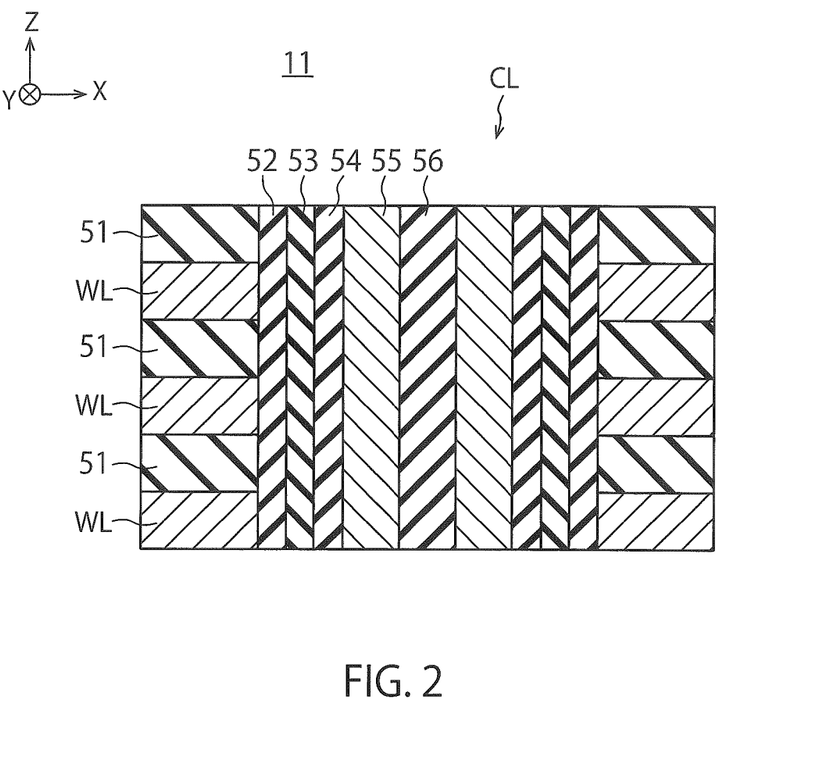
FIG. 2 is a sectional view illustrating a structure of a columnar portion in the first embodiment.

FIG. 2 is a sectional view illustrating a structure of a columnar portion CL in the first embodiment.

As illustrated in FIG. 2, the memory cell array 11 includes a plurality of word lines WL and a plurality of insulating layers 51 which are alternately stacked on the inter layer dielectric 13 (FIG. 1). The word line WL is, for example, a W (tungsten) layer. The insulating layer 51 is, for example, a silicon oxide film.

The columnar portion CL sequentially includes a block insulator 52, a charge accumulation layer 53, a tunnel insulator 54, a channel semiconductor layer 55, and a core insulator 56. The charge accumulation layer 53 is, for example, a silicon nitride film, and is formed on side surfaces of the word lines WL and the insulating layers 51 via the block insulator 52. The charge accumulation layer 53 may be a semiconductor layer such as a polysilicon layer. The channel semiconductor layer 55 is, for example, a polysilicon layer, and is formed on a side surface of the charge accumulation layer 53 via the tunnel insulator 54. The block insulator 52, the tunnel insulator 54, and the core insulator 56 are, for example, silicon oxide films or metal insulators.

Figure 3:
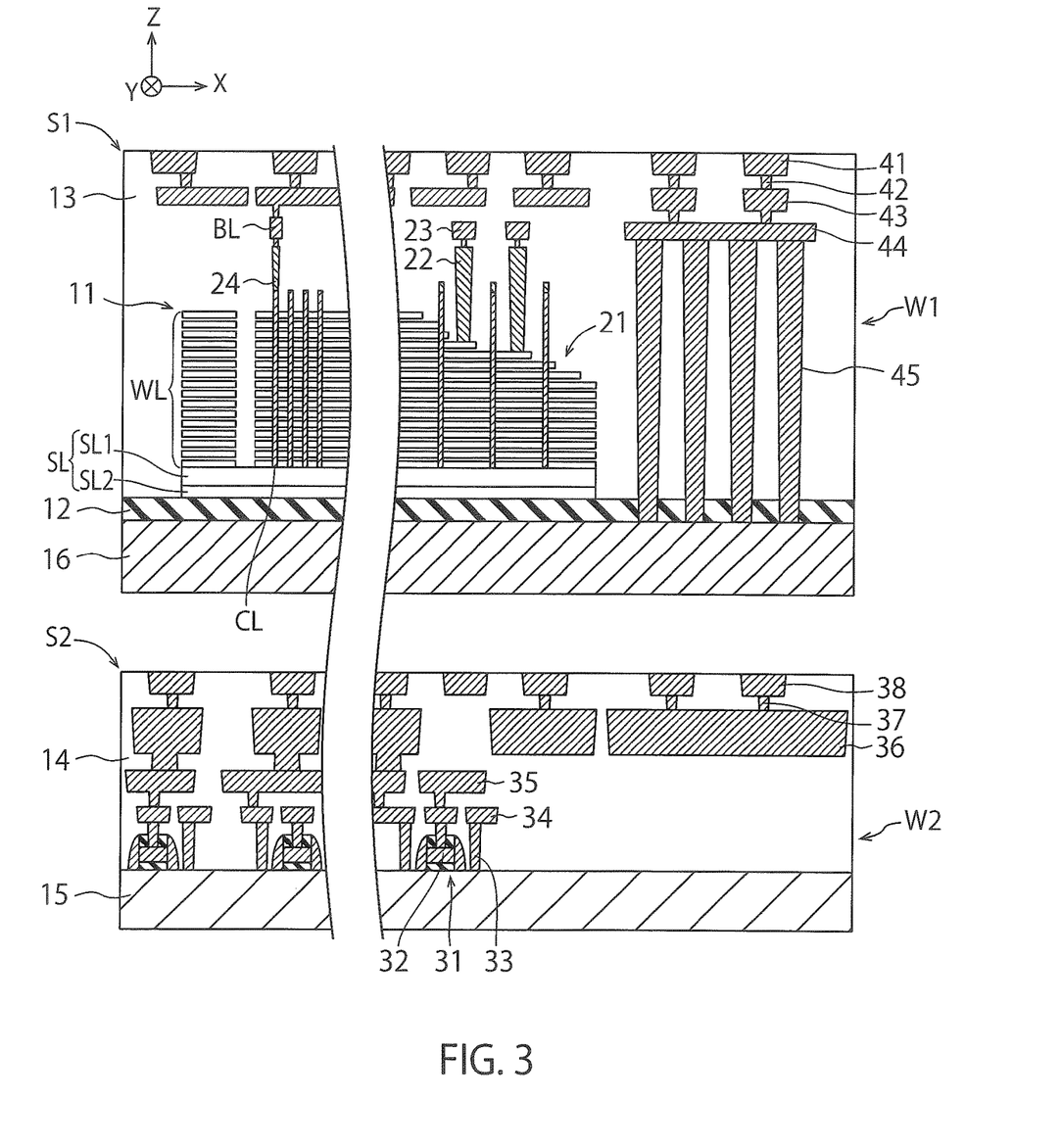
FIG. 3 is a sectional view illustrating a method of manufacturing the semiconductor device in the first embodiment.

FIG. 3 is a sectional view illustrating a method of manufacturing the semiconductor device in the first embodiment. FIG. 3 illustrates an array wafer W1 including a plurality of array chips 1, and a circuit wafer W2 including a plurality of circuit chips 2. The array wafer W1 is also called a memory wafer, and the circuit wafer W2 is also called a CMOS wafer.

It should be noted that a direction of the memory wafer W1 in FIG. 3 is opposite to a direction of the array chip 1 in FIG. 1. In the present embodiment, the semiconductor device is manufactured by bonding the array wafer W1 to the circuit wafer W2. FIG. 3 illustrates the memory wafer W1 before the direction is inverted for bonding, and FIG. 1 illustrates the array chip 1 after the direction is inverted for bonding, and bonding and singulation are performed.

In FIG. 3, a reference numeral S1 indicates an upper surface of the memory wafer W1, and a reference numeral S2 indicates an upper surface of the circuit wafer W2. Note that the memory wafer W1 includes a substrate 16 provided under the insulator 12. The substrate 16 is, for example, a semiconductor substrate such as a silicon substrate. The substrate 15 is an example of a first substrate, and the substrate 16 is an example of a second substrate.

In the present embodiment, first, as illustrated in FIG. 3, the memory cell array 11, the insulator 12, the inter layer dielectric 13, the stepwise structure portion 21, the metal pads 41, or the like, are formed on the substrate 16 of the memory wafer W1, and the inter layer dielectric 14, the transistors 31, the metal pads 38, or the like, are formed on the substrate 15 of the circuit wafer W2. For example, the via plugs 45, the interconnect layer 44, the interconnect layer 43, the via plugs 42 and the metal pads 41 are sequentially formed on the substrate 16. Further, the contact plugs 33, the interconnect layer 34, the interconnect layer 35, the interconnect layer 36, the via plugs 37 and the metal pads 38 are sequentially formed on the substrate 15. Then, the array wafer W1 is bonded to the circuit wafer W2 by a mechanical pressure. By this means, the inter layer dielectric 13 adheres to the inter layer dielectric 14. Then, the array wafer W1 and the circuit wafer W2 are annealed at 400° C. By this means, the metal pads 41 are joined to the metal pads 38.

Then, after the substrate 15 is made thinner through CMP (Chemical Mechanical Polishing), and the substrate 16 is removed through CMP, the array wafer W1 and the circuit wafer W2 are cut into a plurality of chips. The semiconductor device in FIG. 1 is manufactured in this manner. The metal pad 46 and the passivation film 47 are, for example, formed on the insulator 12 after the substrate 15 is made thinner and the substrate 16 is removed.

While, in the present embodiment, the array wafer W1 is bonded to the circuit wafer W2, the array wafers W1 may be bonded to each other instead. Content described above with reference to FIGS. 1 to 3 and content which will be described later with reference to FIGS. 4 to 10 can be also applied to bonding between the array wafers W1.

Further, while FIG. 1 illustrates a boundary surface between the inter layer dielectric 13 and the inter layer dielectric 14, and a boundary surface between the metal pads 41 and the metal pads 38, typically, these boundary surfaces cannot be observed after the above-described annealing.

However, positions of these boundary surfaces can be estimated by, for example, detecting inclination of the side surfaces of the metal pads 41 and side surfaces of the metal pads 38, and misalignment between the side surfaces of the metal pads 41 and the metal pads 38.

Figure 4A:
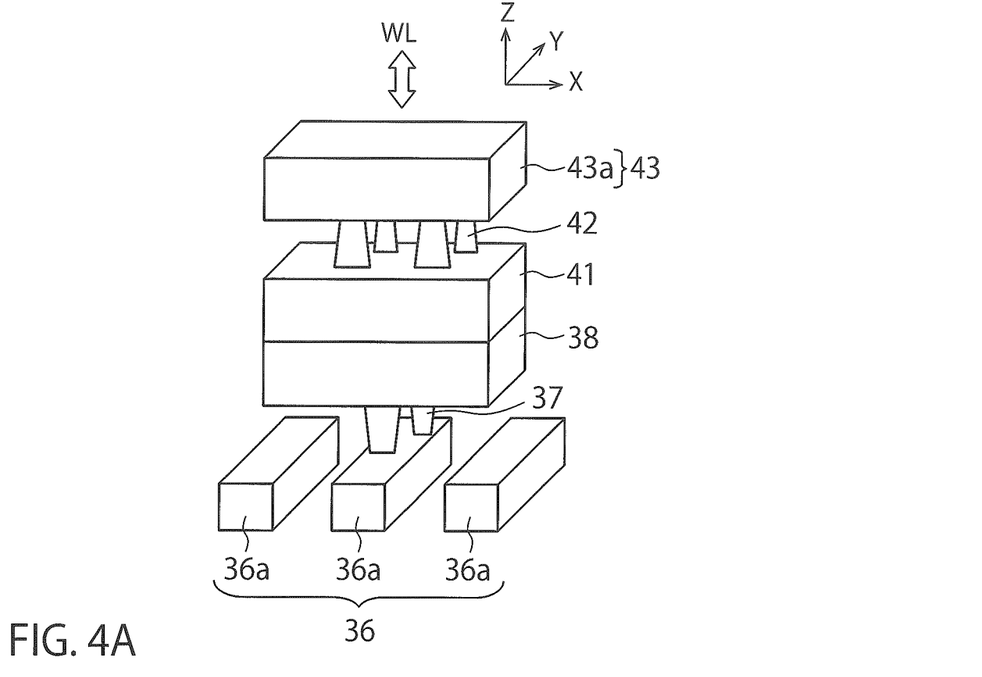
FIGS. 4A and 4B are perspective views illustrating structures of a metal pad, or the like, in the first embodiment.
Figure 4B:
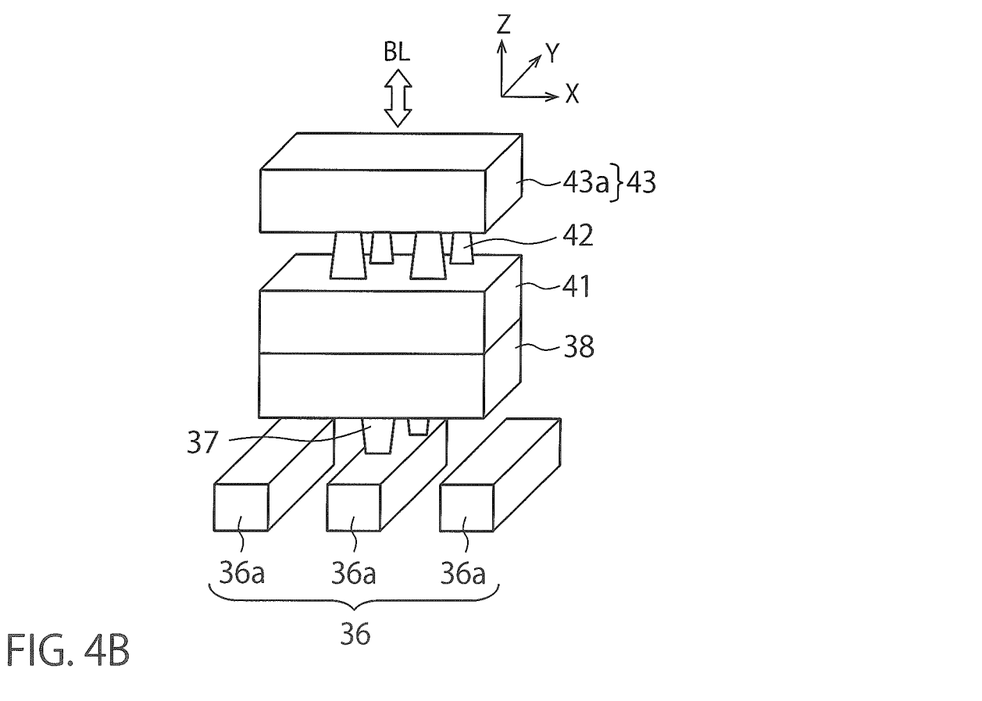

FIGS. 4A and 4B are perspective views illustrating structures of the metal pads 38, 41, or the like, in the first embodiment.

FIG. 4A illustrates a pair of the metal pads 38 and 41 which are electrically connected to the word line WL. In the present embodiment, one or more via plugs 37 are provided on a lower surface of the metal pad 38 which is electrically connected to the word line WL, and one or more via plugs 42 are provided on an upper surface of the metal pad 41 which is electrically connected to the word line WL. In addition, in a pair of the metal pads 38 and 41 which are electrically connected to the word line WL, the number of the via plugs 42 on the upper surface of the metal pad 41 is larger than the number of the via plugs 37 on the lower surface of the metal pad 38. In FIG. 4A, two via plugs 37 are provided on the lower surface of the metal pad 38, and four via plugs 42 are provided on the upper surface of the metal pad 41.

FIG. 4A further illustrates three interconnects 36a which is an example of a plurality of interconnects inside the interconnect layer 36, and one interconnect 43a which is an example of a plurality of interconnects inside the interconnect layer 43. Two via plugs 37 on the lower surface of the metal pad 38 are provided on the same interconnect inside the interconnect layer 36, and, specifically, provided on the interconnect 36a at the center in FIG. 4A. In a similar manner, four via plugs 42 on the upper surface of the metal pad 41 are provided under the same interconnect inside the interconnect layer 43, and, specifically, provided under the interconnect 43a in FIG. 4A.

In this manner, the interconnect 36a at the center in FIG. 4A is electrically connected to two via plugs 37, the interconnect 43a in FIG. 4A is electrically connected to four via plugs 42, and the number of the via plugs 42 is larger than the number of via plugs 37. Therefore, a thickness (width in a Z direction) of the interconnect layer 43 in the present embodiment is set thicker than a thickness (width in a Z direction) of the interconnect layer 36. For example, the thickness of the interconnect layer 36 is 0.5 µm, and the thickness of the interconnect layer 43 is 1.0 µm. The thickness (width in the Z direction) of the via plug 37 may be the same as or different from the thickness (width in the Z direction) of the via plug 42, and either of the via plug 37 or the via plug 42 may be thicker.

The via plugs 42 may be arranged in any array on the metal pad 41. The via plugs 42 in the present embodiment are arranged in a square (or rectangle) lattice shape on the metal pad 41. This square is formed with two sides parallel to the X direction and two sides parallel to the Y direction in a similar manner to the metal pad 41.

The via plugs 37 are also arranged in any array under the metal pad 38. The via plugs 37 in the present embodiment are arranged on a straight line extending in the Y direction under the metal pad 38. In FIG. 4A, three interconnects 38a extend in the Y direction, and the via plugs 37 are arranged in line on the interconnect 38a at the center.

The number of the via plugs 37 on the lower surface of the metal pad 38 may be the number other than two, or the number of the via plugs 42 on the upper surface of the metal pad 41 may be the number other than four. However, the number of the via plugs 42 on the upper surface of the metal pad 41 is preferably set at a square value of the number of the via plugs 37 on the lower surface of the metal pad 38. For example, in a case where the number of the via plugs 37 on the lower surface of the metal pad 38 is set at three, the number of the via plugs 42 on the upper surface of the metal pad 41 is preferably set at nine (=a square value of three). By this means, it is possible to arrange the via plugs 42 in a square (or rectangle) lattice shape without excess or deficiency. Further, it is possible to arrange the via plugs 37 in the same array as an array corresponding to one column of this lattice.

FIG. 4B illustrates a pair of the metal pads 38 and 41 which are electrically connected to the bit line BL. In the present embodiment, one or more via plugs 37 are provided on the lower surface of the metal pad 38 which is electrically connected to the bit line BL, and one or more via plugs 42 are provided on the upper surface of the metal pad 41 which is electrically connected to the bit line BL. In addition, in a pair of the metal pads 38 and 41 which are electrically connected to the bit line BL, the number of the via plugs 42 on the upper surface of the metal pad 41 is larger than the number of the via plugs 37 on the lower surface of the metal pad 38. In FIG. 4B, two via plugs 37 are provided on the lower surface of the metal pad 38, and four via plugs 42 are provided on the upper surface of the metal pad 41. Details of the metal pads 38 and 41 and the via plugs 37 and 42 in FIG. 4B are similar to those in FIG. 4A.

FIG. 4B further illustrates three interconnects 36a which are an example of a plurality of interconnects inside the interconnect layer 36, and one interconnect 43a which is an example of a plurality of interconnects inside the interconnect layer 43. Two via plugs 37 on the lower surface of the metal pad 38 are provided on the same interconnect inside the interconnect layer 36, and, specifically, provided on the interconnect 36a at the center in FIG. 4B. In a similar manner, four via plugs 42 on the upper surface of the metal pad 41 are provided under the same interconnect inside the interconnect layer 43, and, specifically, provided under the interconnect 43a in FIG. 4B. Details of the interconnect layers 36 and 43 in FIG. 4B are similar to those in FIG. 4A.

As described above, in a pair of the metal pads 38 and 41 illustrated in FIGS. 4A and 4B, one or more via plugs 37 are provided on the lower surface of the metal pad 38, and one or more via plugs 42 are provided on the upper surface of the metal pad 41. By this means, it is possible to reduce connection failures between the metal pad 38 and the interconnect 36a and connection failures between the metal pad 41 and the interconnect 43a, because, even if connection of one via plug 37 between the metal pad 38 and the interconnect 36a is abnormal, when connection of another via plug 37 between the metal pad 38 and the interconnect 36a is normal, connection between the metal pad 38 and the interconnect 36a can be normal. This similarly applies to the metal pad 41 and the interconnect 43a. Because there is a case where the semiconductor device in the present embodiment may include, for example, millions of pairs of the metal pads 38 and 41, improvement of a yield due to the metal pads 38 and 41 can considerably contribute to improvement of the yield of the semiconductor device.

Meanwhile, there is a possibility that such arrangement of a number of via plugs 37 and 42 may lower a scale of integration of the semiconductor device. For example, inside the circuit chip 2, it is desired to densely arrange the interconnects 36a to be connected to the word line WL and arrange a signal interconnect near the interconnects 36a to be connected to the bit line BL. Therefore, in a pair of the metal pads 38 and 41 illustrated in FIGS. 4A and 4B, the number of the via plugs 37 on the lower surface of the metal pad 38 is set smaller than the number of the via plugs 42 on the upper surface of the metal pad 41. By this means, it is possible to improve a yield due to the metal pads 38 and 41 while improving a degree of freedom of arrangement of the interconnects 36a inside the circuit chip 2.

FIG. 5 is a plan view illustrating structures of the metal pads 38, 41, or the like, in the first embodiment.

Figure 5A:
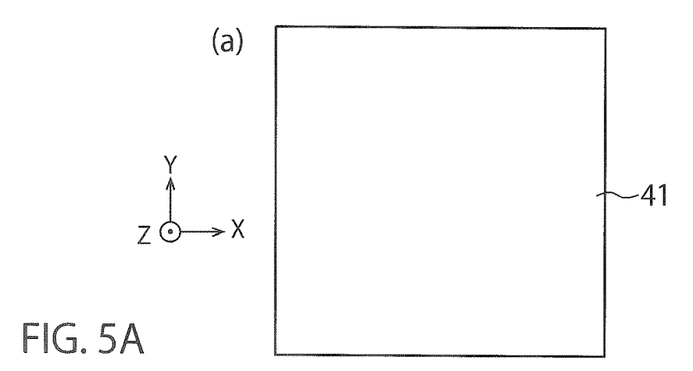
FIGS. 5A to 5D are plan views illustrating the structures 30 of the metal pad, or the like, in the first embodiment.
Figure 5B:
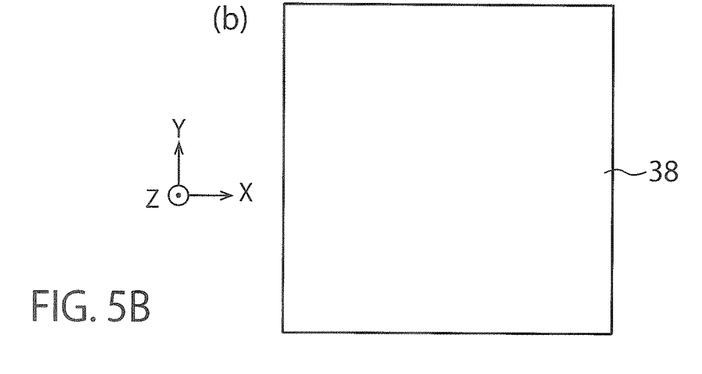

FIGS. 5A and 5B illustrate a pair of the metal pads 41 and 38 which are electrically connected to the word line WL (or the bit line BL). These metal pads 41 and 38 have substantially the same planar shape.

Figure 5C:
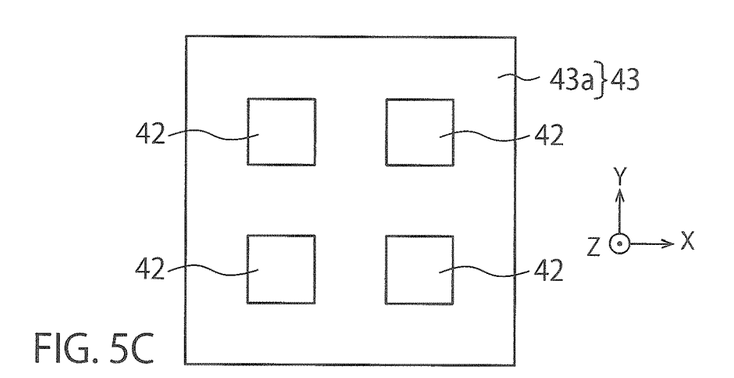
Figure 5D:
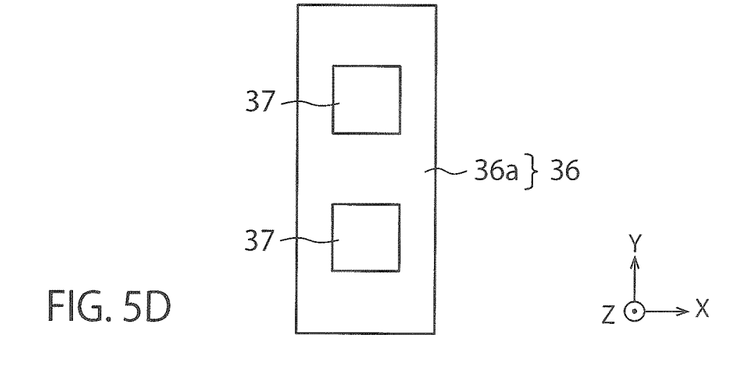

FIG. 5C illustrates four via plugs 42 provided on the metal pad 41 in FIG. 5A, and an interconnect layer 43 including the interconnect 43a provided on these via plugs 42. FIG. 5D illustrates two via plugs 37 provided under the metal pad 38 in FIG. 5B, and the interconnect layer 36 including the interconnect 36a provided under these via plugs 37. The planar shape of the via plugs 42 and 37 is, for example, a square of 0.25 µm×0.25 µm.

Figure 6:
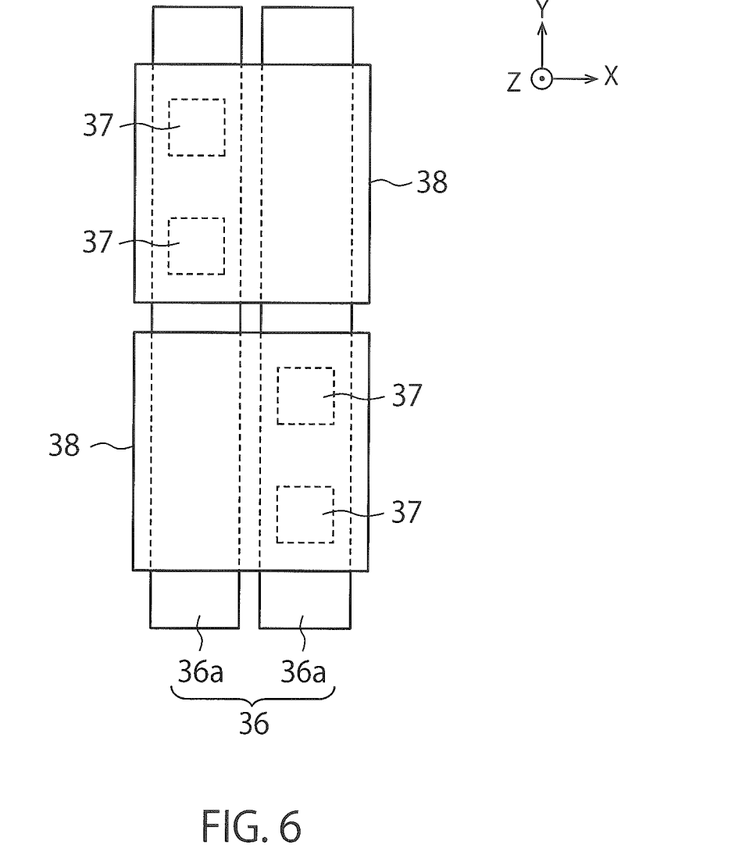
FIG. 6 is a plan view illustrating relationship between the metal pads and interconnects in the first embodiment.

FIG. 6 is a plan view illustrating relationship between the metal pads 38 and the interconnects 36a in the first embodiment.

FIG. 6 illustrates two metal pads 38 which are electrically connected to the word line WL (or the bit line BL), four via plugs 37 provided under these metal pads 38, and the interconnect layer 36 including two interconnects 36a provided under these via plugs 37. These interconnects 36a pass through immediately below the two metal pads 38 and extend in the Y direction. Each metal pad 38 is electrically connected to one of these interconnects 36a by the two via plugs 37.

While each metal pad 38 in the present embodiment has a size at which each metal pad 38 can be connected to four via plugs 37, actually, each metal pad 38 is connected to only two via plugs 37. These via plugs 37 are arranged in line in the Y direction. This allows a width in the X direction of the interconnects 36a which passes through immediately below the metal pads 38 in FIG. 6 to be made narrower, because, while the via plugs 37 on each interconnect 36a are arranged in line in the Y direction, because the via plugs 37 are not arranged in the X direction, it is sufficient if a width in the X direction of each interconnect 36a is set at a width at which each interconnect 36a can be connected to one via plug 37. Therefore, in the present embodiment, it is possible to make the width of the interconnects 36a which passes through immediately below the metal pads 38 narrower, so that it is possible to allow a plurality of interconnects 36a to pass through immediately below each metal pad 38. By this means, it is possible to improve a scale of integration of the semiconductor device.

While two interconnects 36a pass through immediately below the metal pads 38 in FIG. 6, three or more interconnects 36a may pass through immediately below the metal pads 38.

Figure 7:
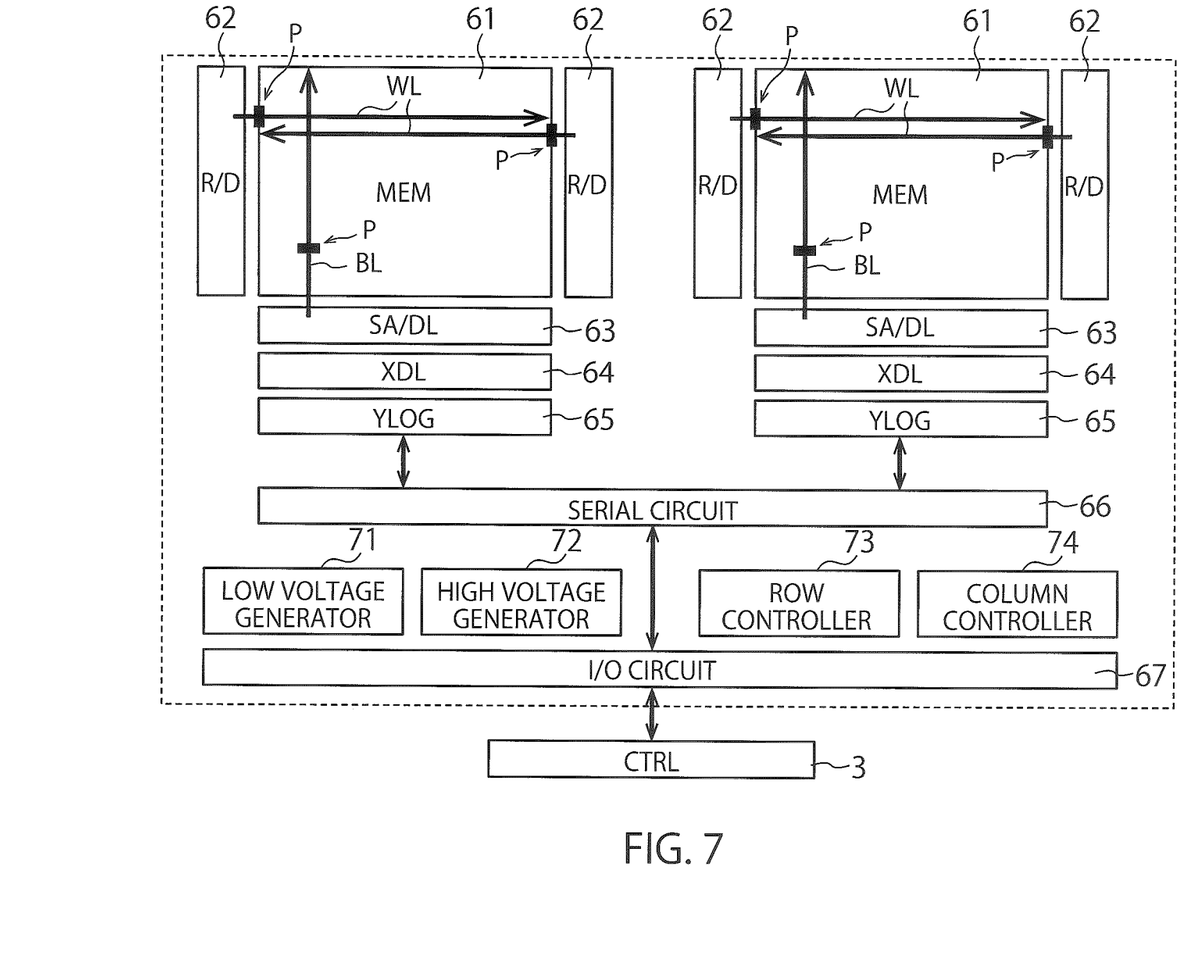
FIG. 7 is a circuit diagram illustrating the structure of the semiconductor device in the first embodiment.

FIG. 7 is a circuit diagram illustrating a structure of the semiconductor device in the first embodiment.

FIG. 7 illustrates a plurality of planes 61 constituting the memory cell array 11, a plurality of row decoders 62 provided for these planes 61, a plurality of SA/DL sections 63, a plurality of XDL sections 64 and a plurality of YLOG sections 65. FIG. 7 further illustrates a serial circuit 66, an I/O (Input/Output) circuit 67, a low voltage generator 71, a high voltage generator 72, a row controller 73 and a column controller 74. These are located inside a logic circuit near the memory cell array 11 inside the array chip 1, or inside the circuit chip 2. FIG. 7 further illustrates a controller 3 included in the semiconductor device in the present embodiment.

Each plane 61 is constituted with a plurality of memory cells, a plurality of word lines WL, a plurality of bit lines BL, or the like. Each row decoder 62 applies a control voltage to a control interconnect such as the word line WL. Examples of such a control voltage can include a write voltage (VPRG), an erase voltage (VERASE), an intermediate voltage (VPASS), a source voltage (VSL), or the like. Each SA/DL section 63 is a sense amplifier circuit and a data latch circuit which detect data read out to the bit line BL. Each XDL section 64 is a data latch circuit which stores data transmitted from the SA/DL section 63 and the I/O circuit 67. Each YLOG section 65 decodes a column address and selects a latch circuit within the XDL section 64 on the basis of a decoding result. The serial circuit 66 provides a serial bus, or the like, to be shared among the plurality of planes 61, and the I/O circuit 67 provides and accepts an input signal and an output signal to and from the controller 3.

The low voltage generator 71 and the high voltage generator 72 constitute a control voltage generator, and respectively generate a low voltage and a high voltage to be used as a control voltage. The row controller 73 and the column controller 74 respectively perform control regarding a row and a column of each plane 61.

A reference numeral P illustrated in FIG. 7 indicates an example of locations where the metal pads 38 and 41 illustrated in FIGS. 4A and 4B are arranged. As illustrated in FIG. 7, the metal pads 38 and 41 illustrated in FIGS. 4A and 4B are, for example, arranged under the bit line BL inside the plane 61 or under the word line WL near the row decoder 62.

Figure 8A:
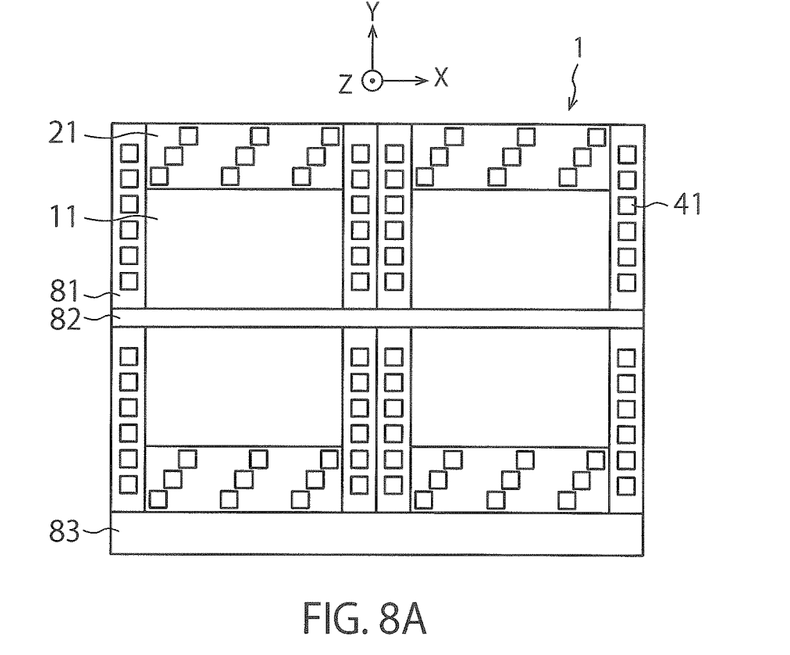
FIGS. 8A and 8B are plan views illustrating the structure of the semiconductor device in the first embodiment.
Figure 8B:
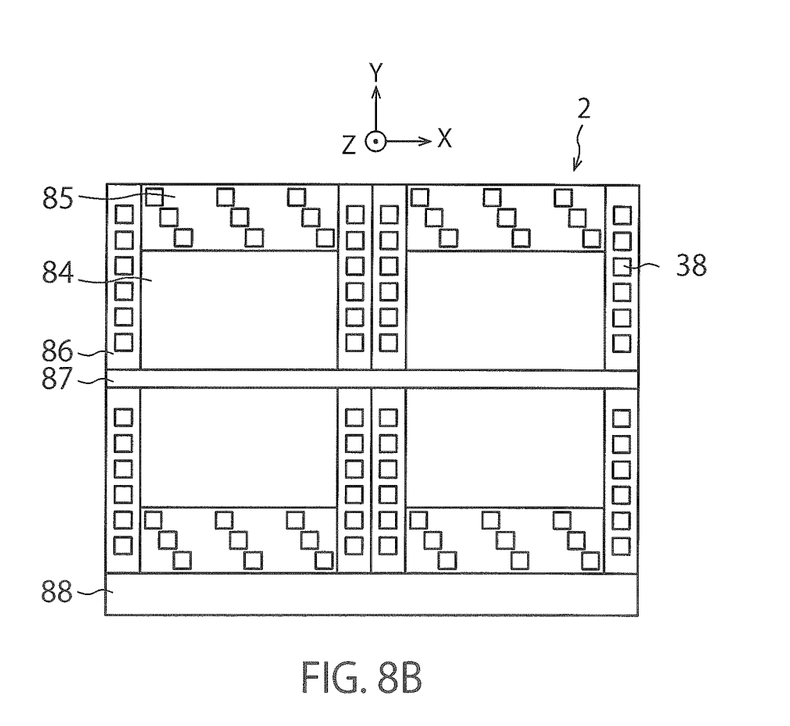

FIGS. 8A and 8B are plan views illustrating a structure of the semiconductor device in the first embodiment.

FIG. 8A illustrates an array chip 1 before being bonded, and FIG. 8B illustrates a circuit chip 2 before being bonded. The array chip 1 includes four memory cell arrays 11, stepwise structure portions 21 and word line terraces 81 of these memory cell arrays 11, terrace space 82 between the memory cell arrays 11, and a pad region 83 for a bonding pad (metal pad 46). The circuit chip 2 includes four peripheral circuit sections 84, SA/YLOG sections 85 and XFER regions 86 of these peripheral circuit sections 84, an interconnect region 87 between the peripheral circuit sections 84, and a pad region 88 for a bonding pad (metal pad 46).

FIGS. 8A and 8B respectively illustrate a plurality of metal pads 41 on the array chip 1 and a plurality of metal pads 38 on the circuit chip 2. The metal pads 41 and 38 (see FIG. 4A) for the word line WL are, for example, arranged on the word line terraces 81 or on the XFER regions 86. The metal pads 41 and 38 (see FIG. 4B) for the bit line BL are, for example, arranged on the stepwise structure portions 21 or on the SA/YLOG sections 85.

Figure 9:
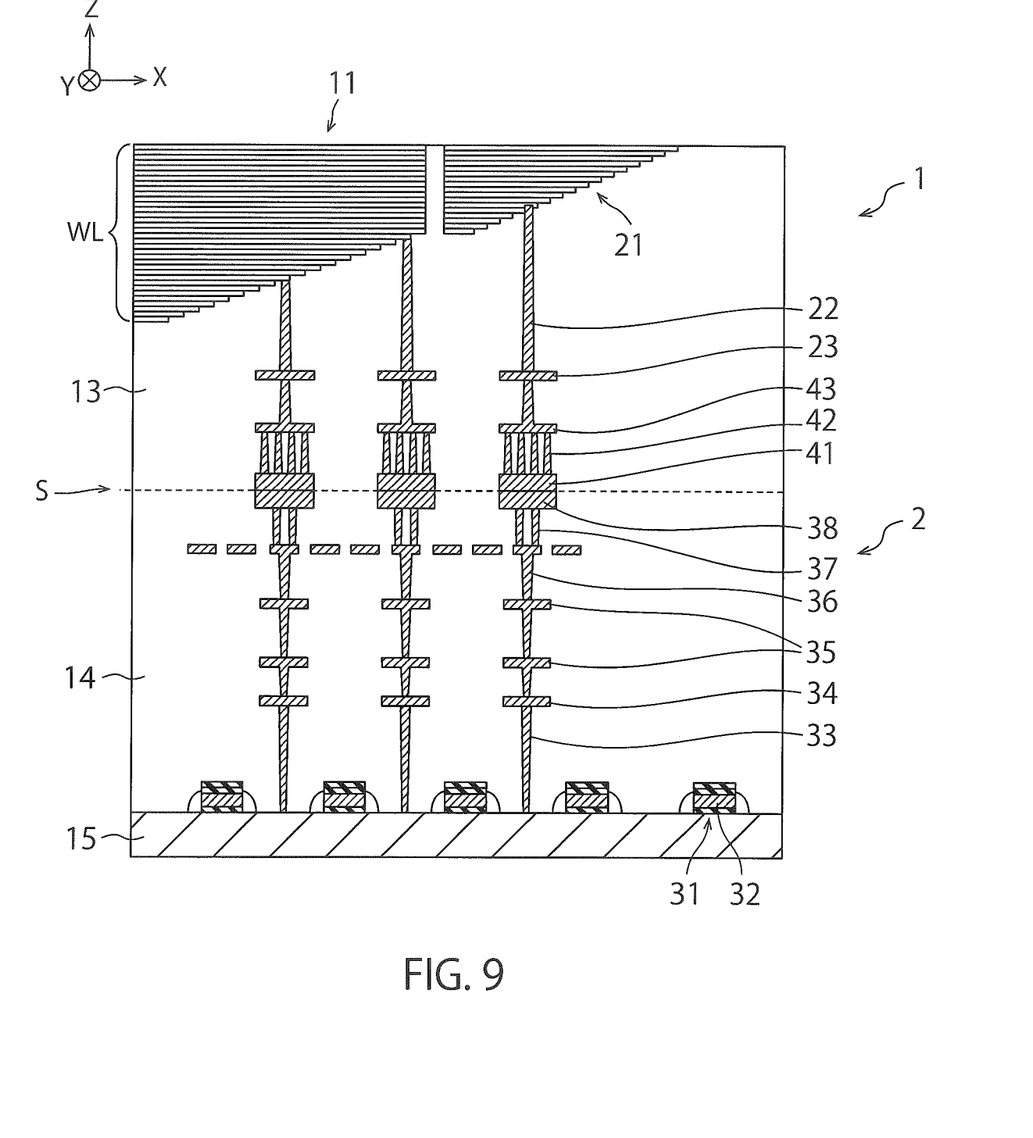
FIG. 9 is a sectional view illustrating an example of relationship between the metal pads and a word line in the first embodiment.

FIG. 9 is a sectional view illustrating an example of relationship between the metal pads 38 and 41 and the word line WL in the first embodiment.

FIG. 9 illustrates the memory cell array 11, the stepwise structure portion 21, the contact plugs 22, and the word interconnect layer 23 inside the array chip 1, and the substrate 15, the transistors 31, the gate electrodes 32, or the like, inside the circuit chip 2, in a similar manner to FIG. 1.

FIG. 9 further illustrates three pairs of the metal pads 38 and 41 which are electrically connected to the word line WL in a similar manner to FIG. 4A. In the metal pads 38 and 41 in each pair, the metal pad 41 is electrically connected to the word line WL via the plurality of via plugs 42, the interconnect layer 43, the word interconnect layer 23 and the contact plug 22, and the metal pad 38 is electrically connected to the transistor 31 via a plurality of via plugs 37, the interconnect layers 36, 35 and 34, and the contact plug 33.

Figure 10:
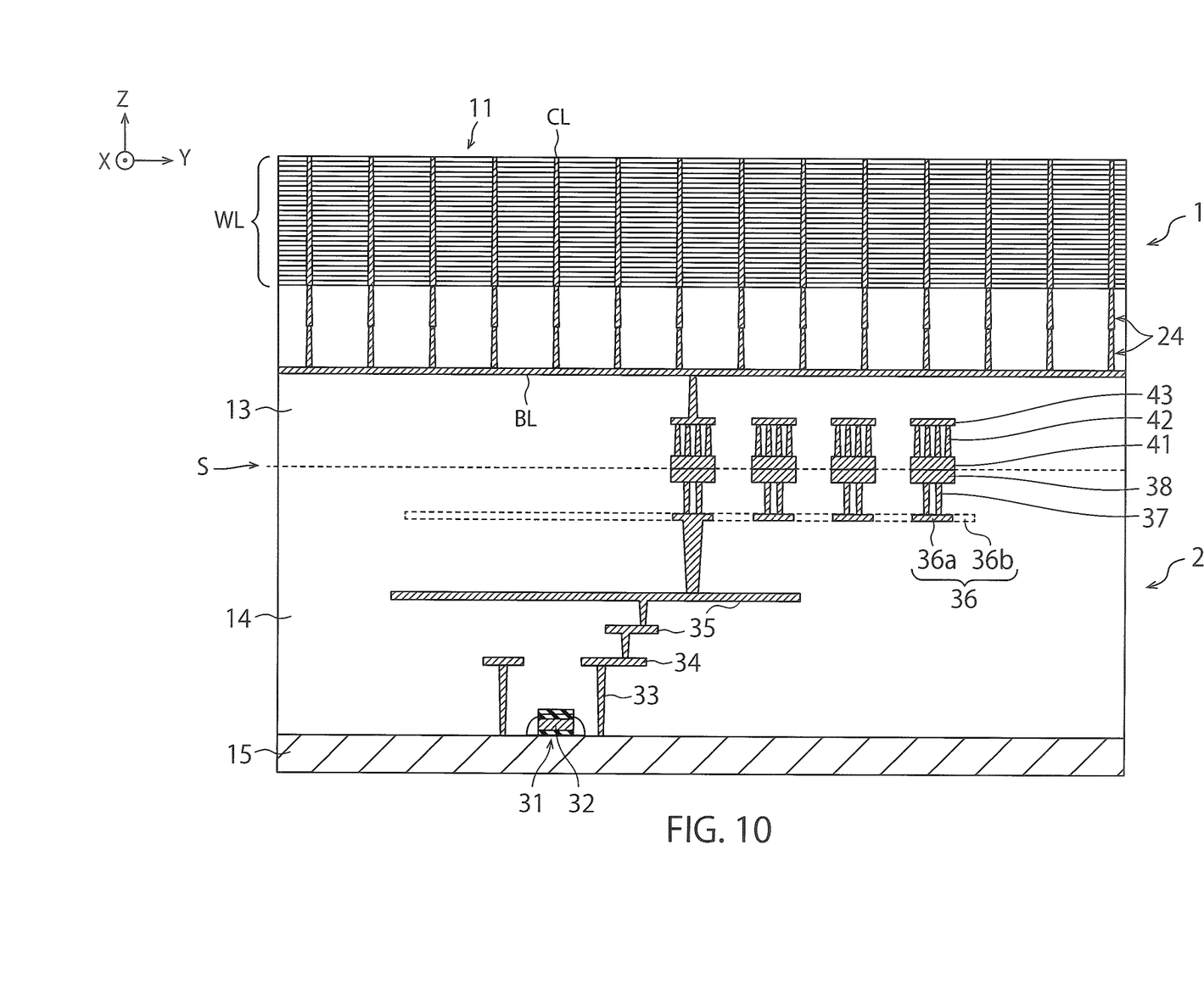
FIG. 10 is a sectional view illustrating an example of relationship between the metal pads and a bit line in the first embodiment.

FIG. 10 is a sectional view illustrating an example of relationship between the metal pads 38 and 41 and the bit line BL in the first embodiment.

FIG. 10 illustrates the memory cell array 11, the columnar portion CL, the via plugs 24 and the bit line BL inside the array chip 1, and the substrate 15, the transistors 31, the gate electrode 32, or the like, inside the circuit chip 2, in a similar manner to FIG. 1.

FIG. 10 further illustrates a pair of the metal pads 38 and 41 which are electrically connected to the bit line BL, and other three pairs of the metal pads 38 and 41 in a similar manner to FIG. 4B. In the metal pads 38 and 41 which are electrically connected to the bit line BL, the metal pad 41 is electrically connected to a plurality of columnar portions CL via a plurality of via plugs 42, the interconnect layer 43, the bit line BL and a plurality of via plugs 24, and the metal pad 38 is electrically connected to the transistor 31 via a plurality of via plugs 37, the interconnect layers 36, 35 and 34 and the contact plug 33.

The interconnect layer 36 in FIG. 10 includes a plurality of interconnects 36a which are electrically connected to a plurality of metal pads 38 in FIG. 10, and other interconnect 36b. While the interconnect 36b is actually arranged at the same height as height of the interconnects 36a in an YZ cross-section different from a YZ cross-section in FIG. 10, the interconnect 36b is indicated with a dotted line in FIG. 10 for explanatory convenience. As illustrated in FIG. 10, the interconnect 36b is long and extends in the Y direction.

The interconnect 36b is, for example, a signal interconnect arranged near the interconnects 36a connected to the bit line BL. Examples of the signal interconnect can include a source line. As described with reference to FIG. 6, in the present embodiment, it is possible to make a width of the interconnects 36a which pass through immediately below the metal pads 38 narrower. Therefore, according to the present embodiment, it is possible to arrange the interconnect 36b near the interconnects 36a, so that it is, for example, possible to allow the interconnect 36b to pass through immediately below the metal pads 38 in a similar manner to the interconnects 36a. By this means, it is possible to improve a scale of integration of the semiconductor device.

As described above, in a pair of the metal pads 38 and 41 in the present embodiment, one or more via plugs 37 are provided on the lower surface of the metal pad 38, one or more via plugs 42 are provided on the upper surface of the metal pad 41, and the number of the via plugs 42 on the upper surface of the metal pad 41 is larger than the number of the via plugs 37 on the lower surface of the metal pad 38. Therefore, according to the present embodiment, it is possible to suitably improve a yield of the semiconductor device due to the metal pads 38 and 41.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a plurality of transistors provided on the substrate;
a first interconnect layer provided above the transistors and electrically connected to at least one of the transistors;
one or more first plugs provided on the first interconnect layer;
one or more first pads provided on the first plugs;
one or more second pads provided on the first pads;
one or more second plugs provided on the second pads;
a second interconnect layer provided on the second plugs; and
a memory cell array provided above the second interconnect layer and electrically connected to the second interconnect layer,
wherein a number of the second plugs on one of the second pads corresponding to one of the first pads is larger than a number of the first plugs under the one of the first pads.

2. The device of claim 1, wherein the number of the second plugs on the one of the second pads is a square value of the number of the first plugs under the one of the first pads.

3. The device of claim 1, wherein the second plugs on the one of the second pads are arranged in a square or rectangle lattice shape.

4. The device of claim 3, wherein the first plugs under the one of the first pads are arranged on a straight line parallel to one of sides of the square or the rectangle.

5. The device of claim 1, wherein the first plugs under the one of the first pads are arranged on a straight line.

6. The device of claim 5, wherein the second plugs on the one of the second pads are arranged in a square or a rectangle lattice shape having a side parallel to the straight line.

7. The device of claim 1, wherein
the first plugs under the one of the first pads are provided on a same interconnect in the first interconnect layer, and
the second plugs on the one of the second pads are provided under a same interconnect in the second interconnect layer.

8. The device of claim 7, wherein a thickness of the second interconnect layer is thicker than a thickness of the first interconnect layer.

9. The device of claim 7, wherein
the first interconnect layer includes two or more interconnects that pass through immediately below the one of the first pads, and
the one of the first pads is electrically connected to one of the two or more interconnects by the first plugs.

10. The device of claim 1, wherein the one of the second pads is electrically connected to a word line or a bit line provided above the substrate, via the second plugs.

11. A method of manufacturing a semiconductor device, comprising:
forming a plurality of transistors on a first substrate;
forming a first interconnect layer electrically connected to at least one of the transistors, above the transistors;
forming one or more first plugs on the first interconnect layer;
forming one or more first pads on the first plugs;
forming a memory cell array on a second substrate;
forming a second interconnect layer electrically connected to the memory cell array, above the memory cell array;
forming one or more second plugs on the second interconnect layer;
forming one or more seconds pads on the second plugs; and
bonding the first pad provided on the first substrate to the second pad provided on the second substrate,
wherein a number of the second plugs on one of the second pads correspond to one of the first pads is larger than a number of the first plugs under the one of the first pads.

12. The method of claim 11, wherein the number of the second plugs on the one of the second pads is a square value of the number of the first plugs under the one of the first pads.

13. The method of claim 11, wherein the second plugs on the one of the second pads are arranged in a square or rectangle lattice shape.

14. The method of claim 13, wherein the first plugs under the one of the first pads are arranged on a straight line parallel to one of sides of the square or the rectangle.

15. The method of claim 11, wherein the first plugs under the one of the first pads are arranged on a straight line.

16. The method of claim 15, wherein the second plugs on the one of the second pads are arranged in a square or rectangle lattice shape having a side parallel to the straight line.

17. The method of claim 11, wherein
the first plugs under the one of the first pads are formed on a same interconnect in the first interconnect layer, and
the second plugs on the one of the second pads are formed on a same interconnect in the second interconnect layer.

18. The method of claim 17, wherein a thickness of the second interconnect layer is thicker than a thickness of the first interconnect layer.

19. The method of claim 17, wherein
the first interconnect layer is formed to include two or more interconnects that pass through immediately below the one of the first pads, and
the one of the first pads is electrically connected to one of the two or more interconnects by the first plug.

20. The method of claim 11, wherein the one of the second pads is electrically connected to a word line or a bit line formed above the second substrate, via the second plug.

* * * * *